United States Patent [19]

Gerber

[11] 4,362,961
[45] Dec. 7, 1982

[54] ENCAPSULATED PIEZOELECTRIC RESONATOR DEVICE

[75] Inventor: Karl-Heinz Gerber, Granges, Switzerland

[73] Assignee: Ebauches, S.A., Switzerland

[21] Appl. No.: 165,213

[22] Filed: Jul. 1, 1980

[30] Foreign Application Priority Data

Jul. 6, 1979 [CH] Switzerland ................. 6341/79

[51] Int. Cl.³ ............................................. H03H 9/24
[52] U.S. Cl. ................................. 310/370; 310/344; 29/25.35
[58] Field of Search ............... 310/370, 367, 348, 344; 29/25.35

[56] References Cited

U.S. PATENT DOCUMENTS 4,110,655  7/1978  Hata et al. ......................... 310/344
4,293,986  10/1981  Kobayashi et al. ................ 310/370

FOREIGN PATENT DOCUMENTS 53-122943  4/1978  Japan ................................. 310/344
2029092  3/1980  United Kingdom ............... 310/344

Primary Examiner—A. T. Grimley
Assistant Examiner—D. L. Rebsch
Attorney, Agent, or Firm—Allegretti, Newitt, Witcoff & McAndrews

[57] ABSTRACT

The invention relates to an encapsulated piezoelectric resonator device comprising an oscillating member having a quartz member and a frame integral with and surrounding the quartz member, the frame having two connecting faces, electrodes on the quartz member, and two cover members, each having a central depression defining a frame provided with a connecting face, each connecting face of the oscillating member being bonded with the connecting face of the cover member for sandwiching the oscillating member between the cover members.

The invention also relates to a method for manufacturing such an encapsulated piezoelectric resonator device comprising the steps of machining a quartz plate by photolithography for making at least one oscillating member, forming electrodes on the quartz member, making at least two cover members having central depressions defining their peripheral frames and bonding the oscillating member with two cover members by their frames.

6 Claims, 4 Drawing Figures

ENCAPSULATED PIEZOELECTRIC RESONATOR DEVICE

BACKGROUND OF THE INVENTION

The invention concerns an encapsulated piezoelectric resonator device and a method for producing such a device.

Tuning fork-type quartz resonators which are encapsulated in a sealed enclosure are known, wherein the upper wall or cover of the enclosure is translucent to enable a laser beam to act on the quartz in order to adjust the frequency of the resonator.

According to the Swiss Patent Application No. 10 517/78 filed on Oct. 10, 1978, the quartz tuning fork is entirely surrounded by a frame produced from the same material. Two other frames of metal for example are fitted on respective sides of the frame of the tuning fork member and act as bracing frames to which the base plate and a cover of the resonator device will be fixed. As the two metal frames are conductors, they also serve to make the electrical connections between the inside and the outside of the enclosure, that is to say, between the electrodes on the tuning fork member and the external electrical circuit.

Although this device is relatively simple, it is made up of a relatively large number of components, which complicates assembly thereof and makes the device thick. It is known that, for a component of a watch, the thickness should be kept as small as possible. Finally, the large number of components including metal frames increases the possibility of parasitic capacitances, which has a detrimental influence on the intrinsic electrical qualities of the component.

BRIEF SUMMARY OF THE INVENTION

For overcoming the drawbacks of the prior art, the invention comprises an encapsulated piezoelectric resonator device comprising an oscillator member which is sandwiched between two cover members. The oscillator member comprises a quartz member integral with a frame. Each cover member is provided with a central depression which defines a peripheral frame. The frame of the oscillator member is directly bonded between the frames of the upper and lower cover members.

The invention also relates to a method for manufacturing the above described resonator devices. According to this method the oscillator member is machined by a photolithographic process. Preferably the method permits the simultaneous manufacture of a plurality of resonator devices.

This improved method consists of the steps of machining a quartz plate by photolithography to define a plurality of oscillating members which remain interconnected; machining two glass or quartz plates to define two assemblies of cover members provided with their respective depressions; bonding said first plate between said two other plates so that the frame of each oscillating member is bonded between the frames of two cover members; and finally separating the resonator devices, each device consisting of an oscillating member sandwiched between two cover members.

BRIEF DESCRIPTION OF THE DRAWINGS

The invention will be described in more detail by way of example, with reference to the accompanying drawings, in which.

DETAILED DESCRIPTION OF A PREFERRED EMBODIMENT

Figure 1:
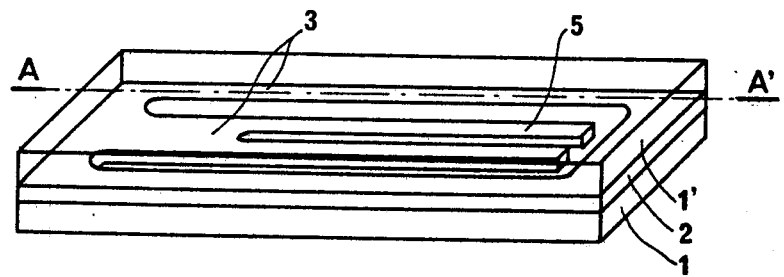
FIG. 1 is a perspective view of one illustrative embodiment of resonator device embodying the invention.
Figure 2:
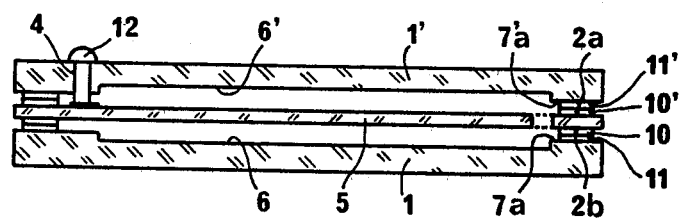
FIG. 2 is a cross-sectional view of the device taken along line A—A' of FIG. 1.
Figure 3:
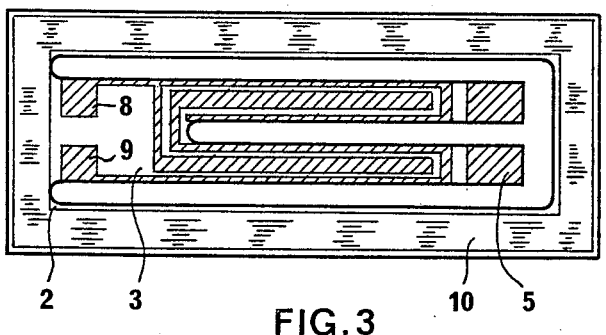
FIG. 3 is a detailed plan view of the quartz tuning fork and the frame means thereof.

Referring to FIG. 1, it is shown that the resonator device comprises an oscillating member 3 and upper and lower cover members 1 and 1', the oscillating member 3 being sandwiched between the two cover members. FIGS. 2 and 3 show that the oscillating member 3 is formed by an oscillating quartz member (e.g. a tuning fork) 5 which is surrounded by a substantially rectangular integral frame 2. The frame 2 is provided with upper and lower connecting faces 2a and 2b. The connecting faces are covered by connecting layers 10 and 10' which may be metal or non-metal. The fork 5 carries metal plating portions which define electrodes 8 and 9. It will be noted that the layers 8, 9 and 10 are not in contact with each other and consequently there is no electrical connection between the frame 2 and the quartz member 5.

The cover members 1 and 1' are provided with central depressions 6 and 6' defining peripherical frames 7 and 7'. The frames 7 and 7' are provided with connecting faces 7a and 7'a. The connecting faces 7a and 7'a have substantially the same shape as the connecting faces 2a and 2b. The connecting faces 7a and 7'a carry connecting layers 11 and 11'. The two covers are substantially identical.

The layers 10, 10', 11, 11' are thin and result in virtually no increase in the thickness of the members 1, 1' and 3. The thickness of the layers is greatly exaggerated in FIG. 2 in order to facilitate understanding of the drawing.

In order to avoid any electrical contact between the frame 2 and the electrode system 8 and 9, the connections between the outside and the inside of the device are effected by way of the covers 1 and 1', for example by means of the passages 4. The advantage of this construction is that, in operation of the piezoelectric resonator, only the electrodes 8 and 9 and not the frame 2 are at a non-zero electrical potential, which reduces parasitic capacitances to a strict minimum.

The two covers 1 and 1' are insulating and preferably translucent. They may be made of glass, amorphous silica, quartz, sapphire, ceramic or any other mineral or organic material which has the particular feature of allowing the beam of a laser to pass therethrough.

The quartz tuning fork 5 and its frame 2 form an integral component; they are produced from the same quartz plate by photolithography.

The assembly of the oscillating member and the cover members is performed either by means of the connecting layers themself or by means of an additive material applied on said layers.

Figure 4:
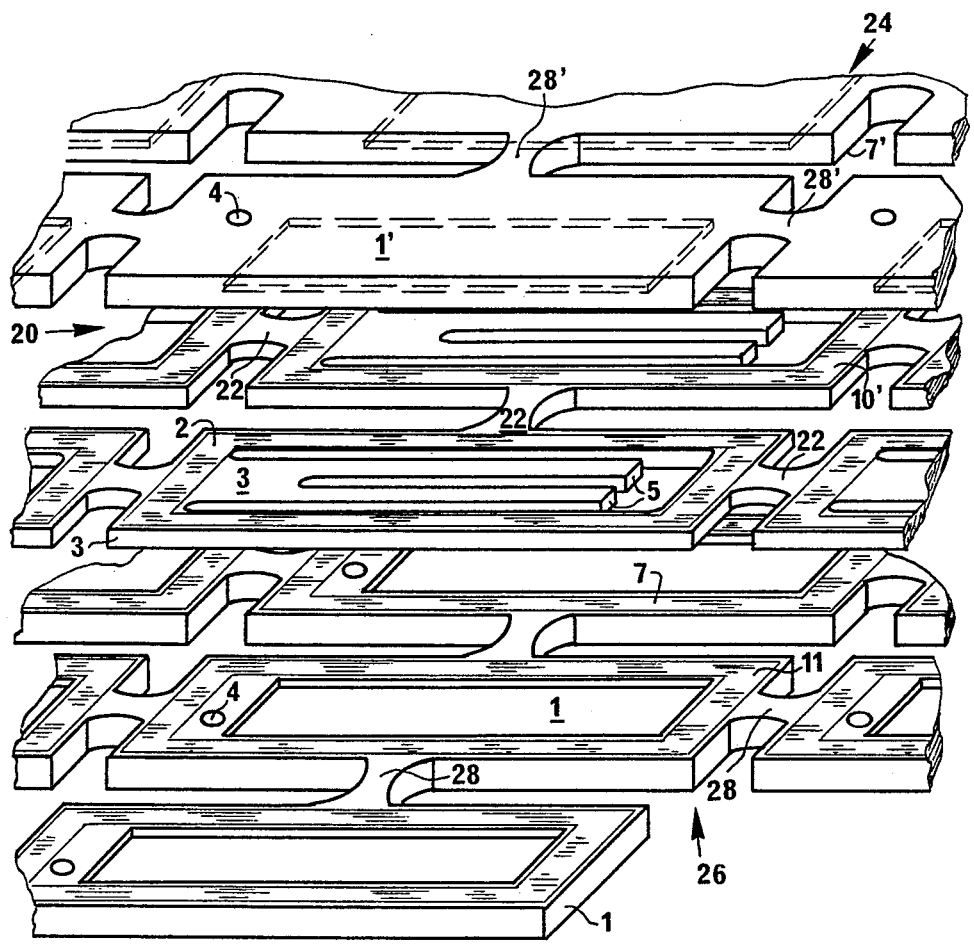
FIG. 4 is a perspective exploded view illustrating the claimed method and showing one plate including a plurality of oscillating members and two plates including a plurality of cover members.

Referring now to FIG. 4, there will be described a preferred way for carrying out the method for manufacturing simultaneously a great number of resonator devices. In a first step, a first quartz plate 20 is etched by a photolithographic process for defining a plurality of oscillator members 3, (only one is completely shown in FIG. 4). The oscillator members remain mechannically assembled by quartz bridges 22 interconnecting the frames 2. In a second step, two other plates of glass or quartz 24 and 26 are etched by photolithographic process for defining respectively the upper cover members 1 and the lower cover members 1'. Similarly the cover members 1 and 1' are mechanically assembled by remaining bridges 28 or 28'. Moreover the depressions 6 and 6' and the passages 4 are machined by photolithographic process.

The electrodes 8 and 9 then are deposited on the forks 5 and the connecting layers 10 and 10' on the connecting faces 2a and 2b of the frame 2. Connecting layers 11 and 11' are also deposited on the connecting faces 7a and 7'a of the frames 7 and 7' of the cover members 1 and 1'. Preferably the connecting layers consist of vacuum deposited gold. Then a low melting point metal is electrolytically deposited on layers 10 and 10' or 11 and 11'. In one preferred embodiment, this metal is tin.

The first plate 20 is sandwiched between the two other plates 24 and 26 so that the frames 2 face the frames 7 and 7' of the two covers 1 and 1' belonging to the two plates. The cover members 1 and 1' are sealed off by heating to the melting temperature of tin in a reducing atmosphere. Finally, the individual resonator devices are separated from each other by breaking the bridges 22, 28 and 28'. This operation may be carried out by providing slots within said bridges and sawing or fracturing said bridges. FIG. 4, only represents a few numbers of members (1, 1', 3) on each quartz plate 20, 24 or 26.

It will be appreciated that this method can be applied to a component-by-component manufacturing. In any case the etching of quartz plates provides connecting faces which are very flat. As a result, the assembly of the resonator devices is simplified.

An injection moulding process may also be used to produce glass plates which are already provided with the depressions 6 and the passages 4. It is also within the scope of this invention to have a procedure which involves cold pressing of the blanks of glass powder, which are subsequently sintered. Finally, the depressions can also be produced on solid components by any suitable mechanical means, such as machining with a diamond or by ultrasonic erosion.

The above-mentioned connecting layers may comprise either noble metals such as gold and silver, or refractory metals such as tungsten and molydenum, or maybe nickel.

The connecting layers may also comprise a non-metallic material which, however, is capable of adhering to the frames 2, 7 and 7', such as low melting point glass or an epoxy resin. This layer is then deposited on the faces 2a or 2b of the frame 2 and on the faces 7a and 7'a of the frames 7 and 7' respectively, and then, if need be, raised to its softening point in order to provide for bonding together of the members 1, 1' and 3.

Finally, there are conducting layers which are formed by metal balls in a glass matrix. Layers of this kind can be used to produce one or other of the connecting layers 10, 10' or 11, 11'. The bonding action is then produced with or without the supplementary addition of a low melting point metal.

The metal layers can be deposited by evaporation under vacuum, by silk-screening, by brushing or by electroless deposition. The non-metal layers (glass or epoxy resin) can be applied by silk-screening, brushing or spraying. Normally, the glass is in powder form, and may or may not be in a carrier paste. The layers deposited by silk-screening, brushing or spraying are commercially available substances such as the pastes marketed by Dupont (Dupont Electronic Product Division, Wilmington, Del., U.S.A.) or EMCA (Emca Mamaroneck, Long Island, U.S.A.).

In some cases, it is advantageous for a galvanic layer, for example of nickel, to be deposited on the silk-screened layer, by means of a Watt bath. Finally, metal plating in the form of a chemical nickel layer may be deposited either on the silk-screened layer or on the vacuum-deposited layer or on the bare frames 2, 7 and 7', by means of a commercially available bath, e.g. (Emplate Ni 415 or pernix Enthone, 8108 Dallikon).

In order to facilitate assembling the various components of the resonator and fitting it to a circuit, certain rules of symmetry should be observed, in particular as regards the terminal passages 4. There may be two passages in one of the covers 1 or 1', or a passage in each cover, as shown in FIG. 4. The latter arrangement makes it possible to use two identical covers 1 and 1', which greatly simplifies manufacture. When the requirements in regard to assembly in a circuit necessitate having two connections on the same side, two passages may be provided in each member 1 and 1'. In this case the passages may be provided in each member 1 and 1'. In this case the passages on one side can be blocked after the connections have been made, by means of an insulating material, low melting point glass or epoxy resin.

As shown in FIG. 2, the connections between the electrodes of the quartz member 5 and the outside, through the passages 4, are formed by terminals 12 which are produced by vacuum deposition, silk-screening, brushing or spraying.

It will be appreciated by those skilled in the art that the invention described is applied not only to quartz members of tuning fork configuration but also to any other form of quartz resonating member.

Various other modifications may be made within the scope of the invention without departing from the principles disclosed in the foregoing illustrative embodiments. It is intended therefore that the accompanying claims be broadly construed consistent with the prior art.

What is claimed is:

1. An encapsulated piezoelectric resonator device comprising:
   an oscillating member including a quartz member and a frame integral with and surrounding said quartz member, said frame having two connecting faces;
   electrodes provided on said quartz member;
   two cover members, each having a central depression defining a frame provided with a connecting face;
   connecting layers covering said connecting faces for bonding and sandwiching said oscillating member between said cover members; and
   conductor passages provided in at least one cover member and passing through said cover member; said conductor passages being in electrical communication with said electrodes, said connecting layers having no contact with said electrodes and said conductor passages.

2. The device of claim 1, wherein at least one of the cover members is translucent.

3. The device according to claim 1, wherein at least one of the cover members is made of a material selected from the group consisting of glass, amorphous silica, quartz, sapphire and ceramic.

4. The device of claim 1, wherein the two cover members are substantially identical.

5. The device of claim 1, wherein said connecting layers are metal layers further comprising an intermediate layer of a metal with a low melting point interposed between said connecting layers.

6. The device of claim 1, wherein said connecting layers are made of fused glass.

* * * * *